(12) United States Patent
Chang et al.

(10) Patent No.: US 10,510,605 B2
(45) Date of Patent: Dec. 17, 2019

(54) SEMICONDUCTOR DIE SINGULATION AND STRUCTURES FORMED THEREBY

(71) Applicant: Taiwan Semiconductor Manufacturing Company, Ltd., Hsinchu (TW)

(72) Inventors: Fu-Chen Chang, Hsinchu (TW); Cheng-Lin Huang, Hsinchu (TW); Wen-Ming Chen, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/043,860

(22) Filed: Jul. 24, 2018

(65) Prior Publication Data

US 2018/0330991 A1 Nov. 15, 2018

Related U.S. Application Data

(62) Division of application No. 15/374,885, filed on Dec. 9, 2016.

(Continued)

(51) Int. Cl.
*H01L 21/00* (2006.01)
*H01L 21/46* (2006.01)
(Continued)

(52) U.S. Cl.
CPC ............ *H01L 21/82* (2013.01); *H01L 21/268* (2013.01); *H01L 21/563* (2013.01); *H01L 23/3142* (2013.01); *H01L 23/544* (2013.01); *H01L 23/562* (2013.01); *H01L 23/585* (2013.01); *H01L 24/17* (2013.01); *H01L 24/81* (2013.01); *H01L 25/0655* (2013.01); *H01L 25/50* (2013.01); *H01L 24/13* (2013.01); *H01L 24/16* (2013.01); *H01L 2223/5446* (2013.01); *H01L 2223/54426* (2013.01);
(Continued)

(58) Field of Classification Search
None
See application file for complete search history.

(56) References Cited

U.S. PATENT DOCUMENTS 6,955,947 B2   10/2005  Dias et al.
7,265,034 B2 *  9/2007  Lu .......................... H01L 21/78
                                                         438/463
(Continued)

FOREIGN PATENT DOCUMENTS

CN       1890797 A     1/2007
CN      101101907 A    1/2008
(Continued)

*Primary Examiner* — Minh Loan Tran
(74) *Attorney, Agent, or Firm* — Slater Matsil, LLP (57) ABSTRACT

An embodiment method includes providing a wafer including a first integrated circuit die, a second integrated circuit die, and a scribe line region between the first integrated circuit die and the second integrated circuit die. The method further includes forming a kerf in the scribe line region and after forming the kerf, using a mechanical sawing process to fully separate the first integrated circuit die from the second integrated circuit die. The kerf extends through a plurality of dielectric layers into a semiconductor substrate.

19 Claims, 9 Drawing Sheets

Related U.S. Application Data (60) Provisional application No. 62/368,736, filed on Jul. 29, 2016.

(51) Int. Cl.

| | | |
|---|---|---|
| *H01L 21/82* | (2006.01) | |
| *H01L 23/00* | (2006.01) | |
| *H01L 21/268* | (2006.01) | |
| *H01L 21/56* | (2006.01) | |
| *H01L 23/31* | (2006.01) | |
| *H01L 23/544* | (2006.01) | |
| *H01L 23/58* | (2006.01) | |
| *H01L 25/065* | (2006.01) | |
| *H01L 25/00* | (2006.01) | |

(52) U.S. Cl.
CPC ......... *H01L 2224/0345* (2013.01); *H01L 2224/0362* (2013.01); *H01L 2224/03462* (2013.01); *H01L 2224/03464* (2013.01); *H01L 2224/0401* (2013.01); *H01L 2224/05124* (2013.01); *H01L 2224/05147* (2013.01); *H01L 2224/05166* (2013.01); *H01L 2224/05184* (2013.01); *H01L 2224/05572* (2013.01); *H01L 2224/05647* (2013.01); *H01L 2224/05684* (2013.01); *H01L 2224/1145* (2013.01); *H01L 2224/1146* (2013.01); *H01L 2224/11452* (2013.01); *H01L 2224/131* (2013.01); *H01L 2224/13025* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13609* (2013.01); *H01L 2224/13611* (2013.01); *H01L 2224/13616* (2013.01); *H01L 2224/13639* (2013.01); *H01L 2224/13644* (2013.01); *H01L 2224/13655* (2013.01); *H01L 2224/13664* (2013.01); *H01L 2224/16112* (2013.01); *H01L 2224/16113* (2013.01); *H01L 2224/16146* (2013.01); *H01L 2224/16227* (2013.01); *H01L 2224/16235* (2013.01); *H01L 2224/17181* (2013.01); *H01L 2224/32145* (2013.01); *H01L 2224/32225* (2013.01); *H01L 2224/73204* (2013.01); *H01L 2224/81815* (2013.01); *H01L 2224/92125* (2013.01); *H01L 2224/94* (2013.01); *H01L 2924/10156* (2013.01); *H01L 2924/10157* (2013.01); *H01L 2924/14* (2013.01); *H01L 2924/15192* (2013.01); *H01L 2924/15311* (2013.01); *H01L 2924/18161* (2013.01)

(56) References Cited

U.S. PATENT DOCUMENTS

| | | |
|---|---|---|
| 7,265,438 B2 | 9/2007 | Tsai et al. |
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |
| 8,048,778 B1 | 11/2011 | Ku et al. |
| 8,071,429 B1 | 12/2011 | Qian et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,563,359 B2 | 10/2013 | Watanabe |
| 8,624,157 B2 * | 1/2014 | Albelo ............. B23K 26/386 219/121.72 |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 8,809,120 B2 | 8/2014 | Miccoli et al. |
| 9,337,063 B2 * | 5/2016 | Chen ................. H01L 25/0652 |
| 2004/0188862 A1 | 9/2004 | Nagarajan et al. |
| 2005/0101108 A1 | 5/2005 | Genda et al. |
| 2005/0130390 A1 | 6/2005 | Andrews et al. |
| 2006/0189009 A1 | 8/2006 | Lu et al. |
| 2006/0189099 A1 | 8/2006 | Lu et al. |
| 2007/0257365 A1 | 11/2007 | Lu et al. |
| 2007/0272668 A1 | 11/2007 | Albelo et al. |
| 2010/0072635 A1 | 3/2010 | Kuo et al. |
| 2011/0147898 A1 | 6/2011 | Hosier et al. |
| 2011/0193200 A1 | 8/2011 | Lyne et al. |
| 2011/0287607 A1 | 11/2011 | Osako et al. |
| 2011/0304007 A1 | 12/2011 | Watanabe |
| 2012/0077295 A1 | 3/2012 | Shen et al. |
| 2012/0211748 A1 | 8/2012 | Miccoli et al. |
| 2012/0322242 A1 | 12/2012 | Lei et al. |
| 2014/0001645 A1 | 1/2014 | Lin et al. |
| 2014/0103527 A1 | 4/2014 | Marimuthu et al. |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0348872 A1 | 12/2015 | Kuo et al. |
| 2016/0163934 A1 | 6/2016 | Peddada et al. |
| 2016/0315010 A1 | 10/2016 | Van Der Stan |
| 2017/0345774 A1 | 11/2017 | Jackson et al. |

FOREIGN PATENT DOCUMENTS

| | | |
|---|---|---|
| CN | 100477161 C | 4/2009 |
| CN | 101685794 A | 3/2010 |
| CN | 102437254 A | 5/2012 |
| CN | 102543868 A | 7/2012 |
| CN | 101490819 B | 6/2013 |
| CN | 105378948 A | 3/2016 |
| TW | 200631008 A | 9/2006 |
| TW | 201322391 A | 6/2013 |

* cited by examiner

SEMICONDUCTOR DIE SINGULATION AND STRUCTURES FORMED THEREBY

PRIORITY CLAIM AND CROSS-REFERENCE

This application is a divisional of U.S. application Ser. No. 15/374,885, filed Jul. 29, 2016, which claims the benefits of U.S. Provisional Application Ser. No. 62/368,736, filed on Jul. 29, 2016, which applications are hereby incorporated herein by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in a certain context, namely a semiconductor die in a chip-on-wafer-on-substrate (CoWoS) package. Various embodiments may be applied, however, to semiconductor die singulation in other package configurations.

Figure 1A:
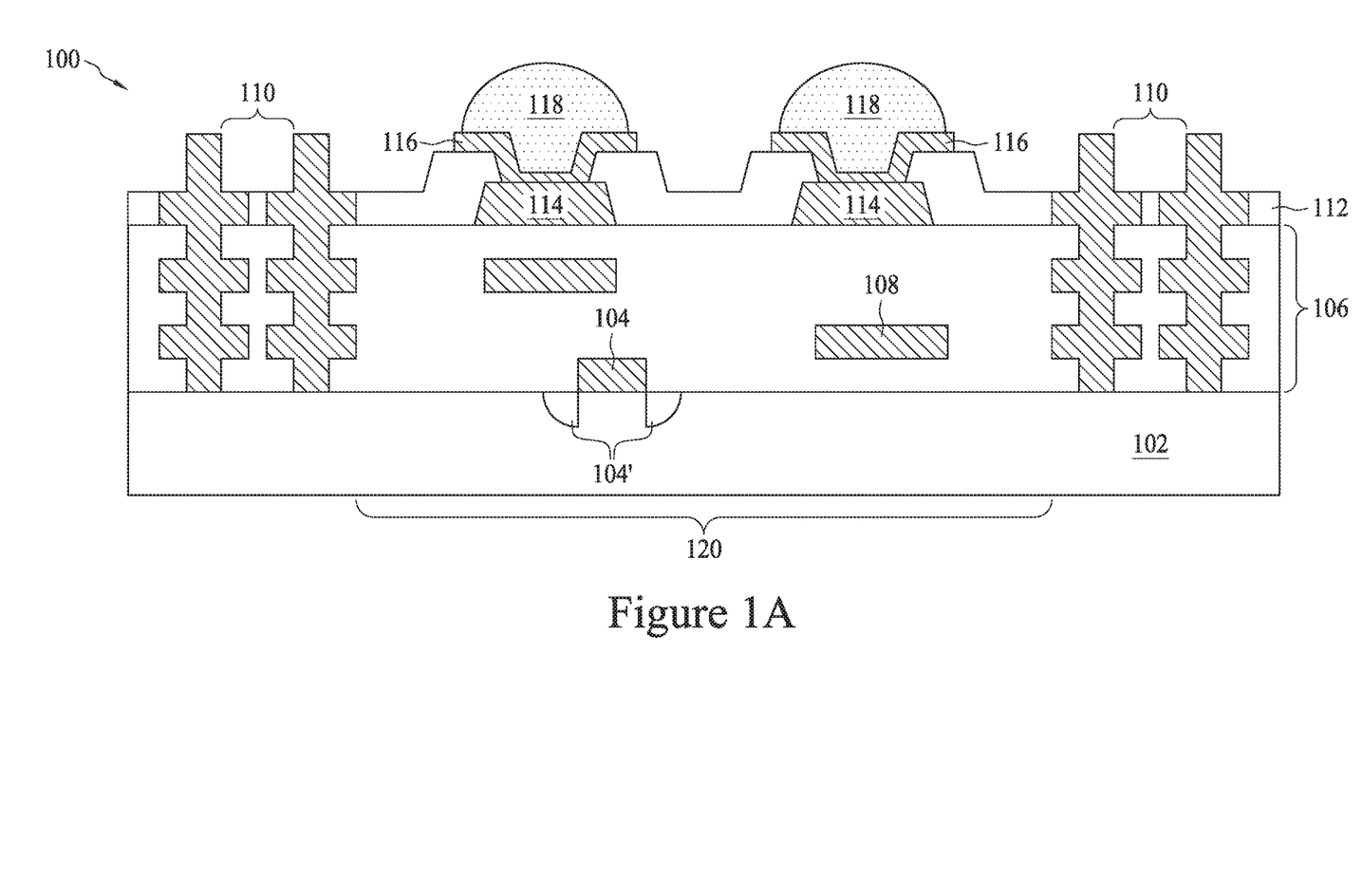
FIGS. 1A though 1C illustrate varying views of a semiconductor die in a wafer in accordance with some embodiments.

FIG. 1A illustrates a cross-sectional view of a die 100 according to some embodiments. Die 100 may be a semiconductor die and could be any type of integrated circuit, such as a processor, logic circuitry, memory, analog circuit, digital circuit, mixed signal, and the like. Although referred to as a die throughout, some or all processing to die 100 may occur while die 100 is part of a larger wafer 200 (see FIG. 1B). For example, wafer 200 includes multiple dies 100 (e.g., each having features as described with respect to FIG. 1A), and a singulation process may be applied to separate dies 100 along a scribe line region 202 between adjacent dies 100 as described in greater detail below.

Die 100 may include a substrate 102, active devices 104, and an interconnect structure 106 over the substrate. Substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices 104 such as transistors, capacitors, resistors, diodes, photo-diodes, fuses, and the like may be formed at the top surface of substrate 102. Interconnect structure 106 may be formed over active devices 104 and substrate 102. Interconnect structure 106 may include inter-layer dielectric (ILD) and/or inter-metal dielectric (IMD) layers containing conductive features 108 (e.g., conductive lines and vias) formed using any suitable method. The ILD and IMD layers may include low-k dielectric materials having k values, for example, lower than about 4.0 or extra low-k (ELK) dielectric materials having k values, for example, lower than about 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD).

Conductive features 108 may be formed by a damascene process, such as single damascene or a dual damascene process. Conductive features 108 are formed of a conductive material (e.g., comprising copper, aluminum, tungsten, combinations thereof, and the like), and conductive features 108 may be lined with a diffusion barrier layer and/or an adhesion layer (not shown). The diffusion barrier layer may be formed of one or more layers of TaN, Ta, TiN, Ti, CoW, or the like. Conductive features 108 in interconnect structure 106 electrically connects various active devices 104 to form functional circuits within die 100. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the various embodiments and are not meant to limit various embodiments in any manner. Other circuitry may be used as appropriate for a given application.

It should also be noted that one or more etch stop layers (not shown) may be positioned between adjacent ones of the ILD and IMD layers. Generally, the etch stop layers provide a mechanism to stop an etching process when forming vias and/or contacts. The etch stop layers are formed of a dielectric material having a different etch selectivity from adjacent layers, e.g., the underlying substrate 102 and the overlying interconnect structure 106. In an embodiment, the etch stop layers may be formed of SiN, SiCN, SiCO, CN, combinations thereof, or the like, deposited by CVD or PECVD techniques.

Figure 1B:
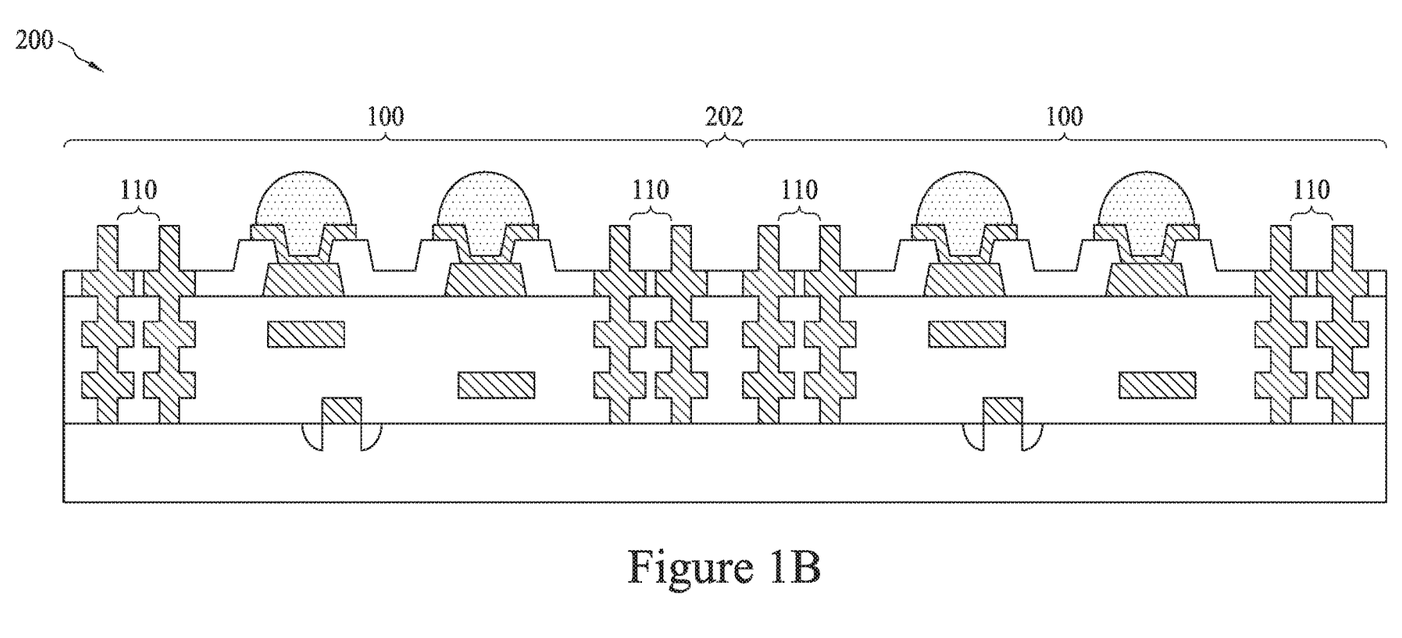
Figure 1C:
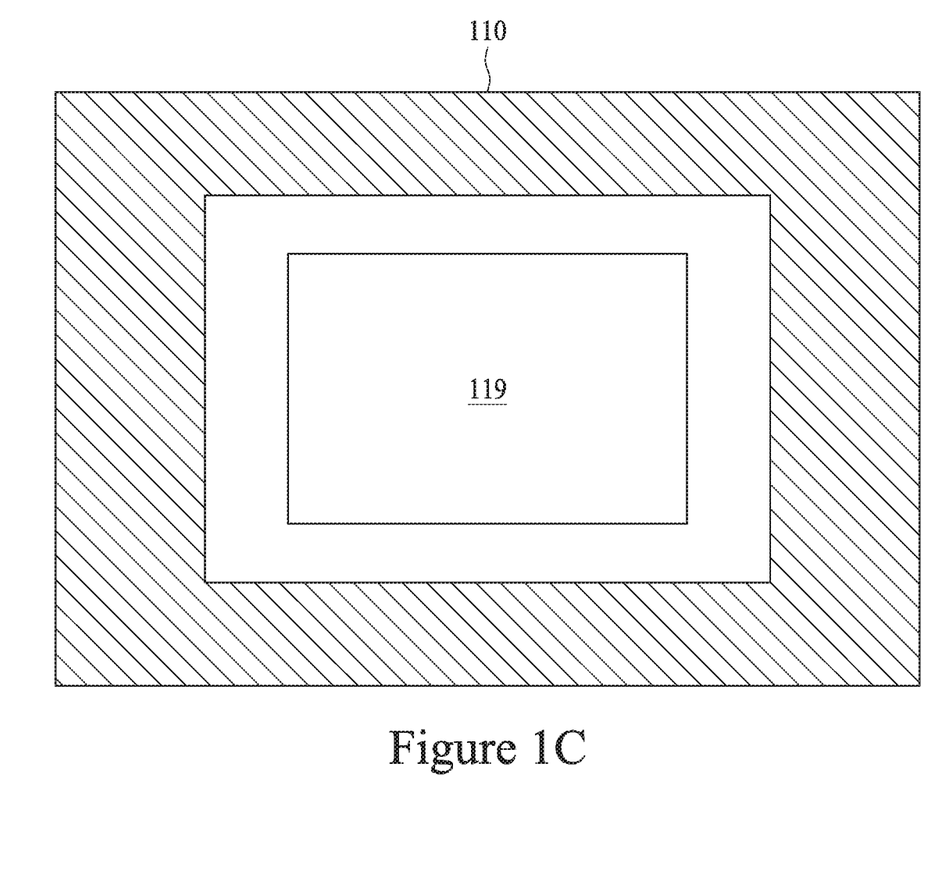

As further illustrated by FIG. 1A, interconnect structure 106 further includes one or more seal rings 110, which may also extend through the ILD and IMD layers adjacent conductive features 108. Seal rings 110 may provide protection for the features of die 100 (e.g., conductive features 108) from water, chemicals, residue, and/or contaminants that may be present during the processing of die 100. Each seal ring 110 may be formed along a periphery of die 100 and may be a continuous structure formed to surround a functional circuit region 120 of die 100 (e.g., the region of die 100 having active devices 104 and conductive features 108 formed there) as illustrated in the top down view of die 100 provided in FIG. 1C. In FIG. 1C, a single seal ring 110 is illustrated although multiple seal rings may be included (e.g., see FIG. 1A). Furthermore, in FIG. 1C, seal ring 110 is substantially rectangular in shape although, in other embodiments, seal rings 110 may have a different shape in a top down view. As illustrated by FIG. 1B, dies 100 in wafer 200 are separated by a scribe line region 202 (e.g., disposed between seal rings 110 of adjacent dies 100).

Referring back to FIG. 1A, seal rings 110 may be formed of a conductive material. In an embodiment, seal rings 110 are formed by a same material, at a same time, and by a same process(es) as conductive features 108. For example, seal rings 110 may include conductive line portions in various ILD and IMD layers with conductive via portions connecting the conductive line portions between ILD and IMD layers.

In various embodiments, seal rings 110 may be electrically isolated from active devices 104, and seal rings 110 may not form any functional circuits with active devices 104. Seal rings 110 may be spaced apart from functional circuit region 119 of die 100 by a minimum spacing. By including minimum spacing between seal rings 110 and functional circuits, the risk of damage to conductive features 108 during the formation of seal ring 110 may be reduced. Furthermore, although FIG. 1A illustrates seal ring 110 as stopping at a top surface of substrate 102, in other embodiments, seal ring 110 may extend into substrate 102. In some embodiments, a bottom of seal ring 110 may be substantially level or lower than bottoms of active device regions (e.g., source/drain regions 104') in substrate 102.

Die 100 further comprise pads 114, such as aluminum pads, to which external connections are made. Pads 114 may provide electrical connection to active devices 104 through conductive features 108. Pads 114 are on what may be referred to as respective active sides of die 100. Passivation films 112 is disposed over interconnect structure 106 and on portions of pads 114. Passivation films 112 may include a single passivation layer or a multi-layer structure. In some embodiments, passivation films 112 may include a similar material as underlying ILD and IMD layers (e.g., a low-k dielectric). In other embodiments, passivation films 112 may be formed of non-organic materials such as silicon oxide, un-doped silicate glass, silicon oxynitride, and the like. Other suitable passivation materials may also be used.

Openings may be patterned through passivation films 112 to expose respective center portions of pads 114. Pads 116 are formed in the openings through the passivation films 112 and may be referred to as under bump metallurgies (UBMs) 116. In the illustrated embodiment, pads 116 are formed through openings in passivation films 112 to pads 114. As an example to form pads 116, a seed layer (not shown) is formed over passivation films 112. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to pads 116 and optionally the portion of seal rings 110 over passivation films 112. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form pads 116. The remaining portions of the seed layer may optionally further provide portions of seal rings 110 above passivation films 112. In the embodiment, where pads 116 are formed differently, more photoresist and patterning steps may be utilized.

Conductive connectors 118 are formed on UBMs 116. Conductive connectors 118 may be BGA connectors, solder balls, metal pillars, controlled collapse chip connection (C4) bumps, micro bumps, electroless nickel-electroless palladium-immersion gold technique (ENEPIG) formed bumps, or the like. Conductive connectors 118 may include a conductive material such as solder, copper, aluminum, gold, nickel, silver, palladium, tin, the like, or a combination thereof. In some embodiments, conductive connectors 118 are formed by initially forming a layer of solder through such methods such as evaporation, electroplating, printing, solder transfer, ball placement, or the like. Once a layer of solder has been formed on the structure, a reflow may be performed in order to shape the material into the desired bump shapes. In another embodiment, conductive connectors 118 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of metal pillar connectors 118. The metal cap layer may include nickel, tin, tin-lead, gold, silver, palladium, indium, nickel-palladium-gold, nickel-gold, the like, or a combination thereof and may be formed by a plating process.

Figure 2:
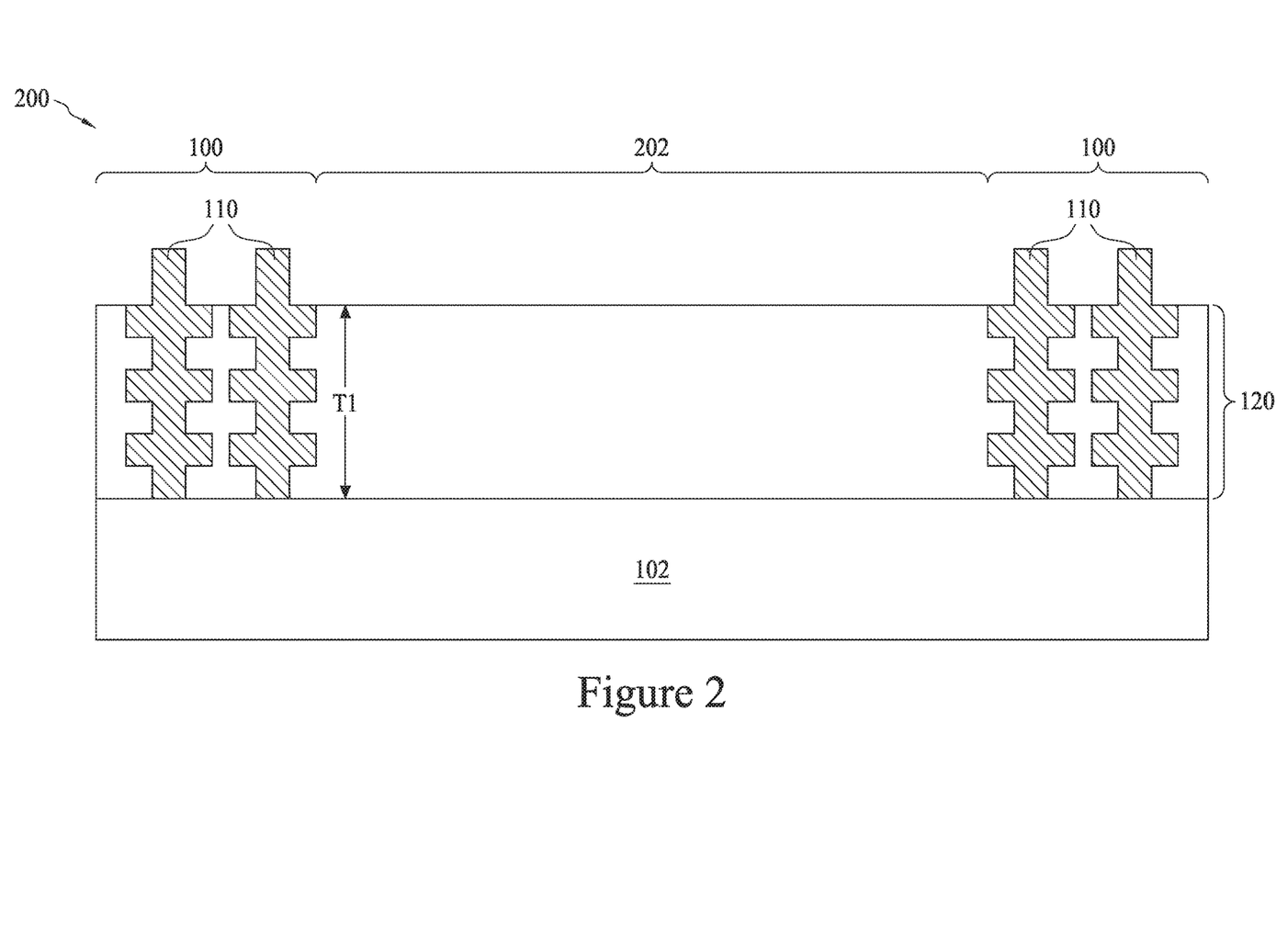
FIGS. 2 through 5 illustrate cross-sectional views of various intermediary steps of singulating a semiconductor die in accordance with some embodiments.

FIG. 2 illustrates a scribe line region 202 of wafer 200. Scribe line region 202 is disposed between seal rings 110 of adjacent dies 100. Each of the dies 100 may have similar features as described in FIGS. 1A, 1B, and 1C where like reference numerals indicate like elements formed using like processes. For example, each die 100 includes a semiconductor substrate 102, dielectric layers 120 (e.g., including low-k dielectric layers of interconnect structure 106 and passivation films 112, see FIG. 1A), and seal rings 110. In some embodiments, a thickness T1 of dielectric layers 120 may be about 10 μm. In other embodiments, dielectric layers 120 may have a different dimension. Although a single scribe line region 202 is illustrated, each die 100 may be surrounded on all sides (e.g. four sides) by scribe line regions 202 in a top-down view of wafer 200 (not illustrated). Embodiment singulation processes as described below may be applied to all sides of each die 100 to fully separate dies 100 from other features in wafer 200.

Figure 3:
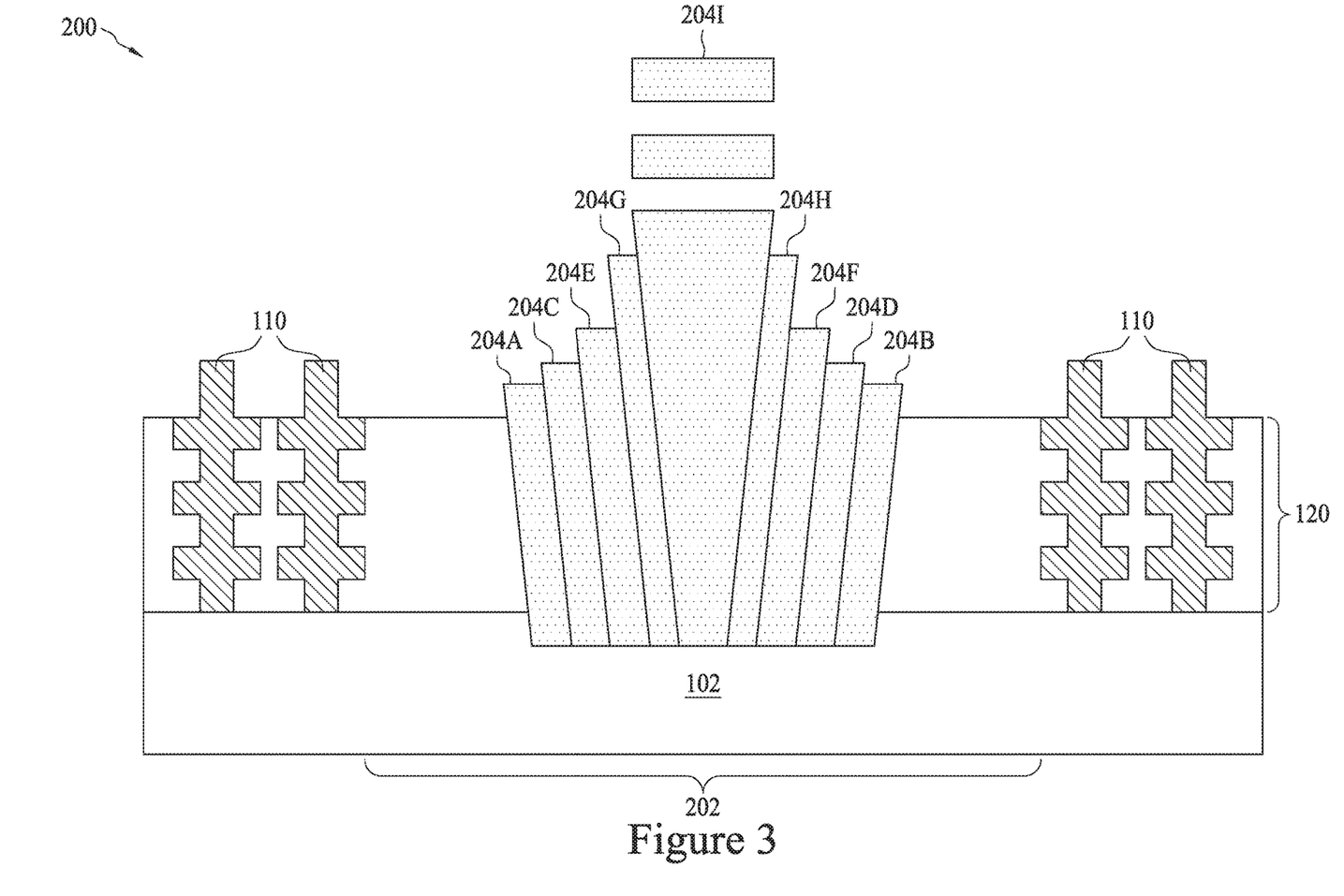
Figure 4:
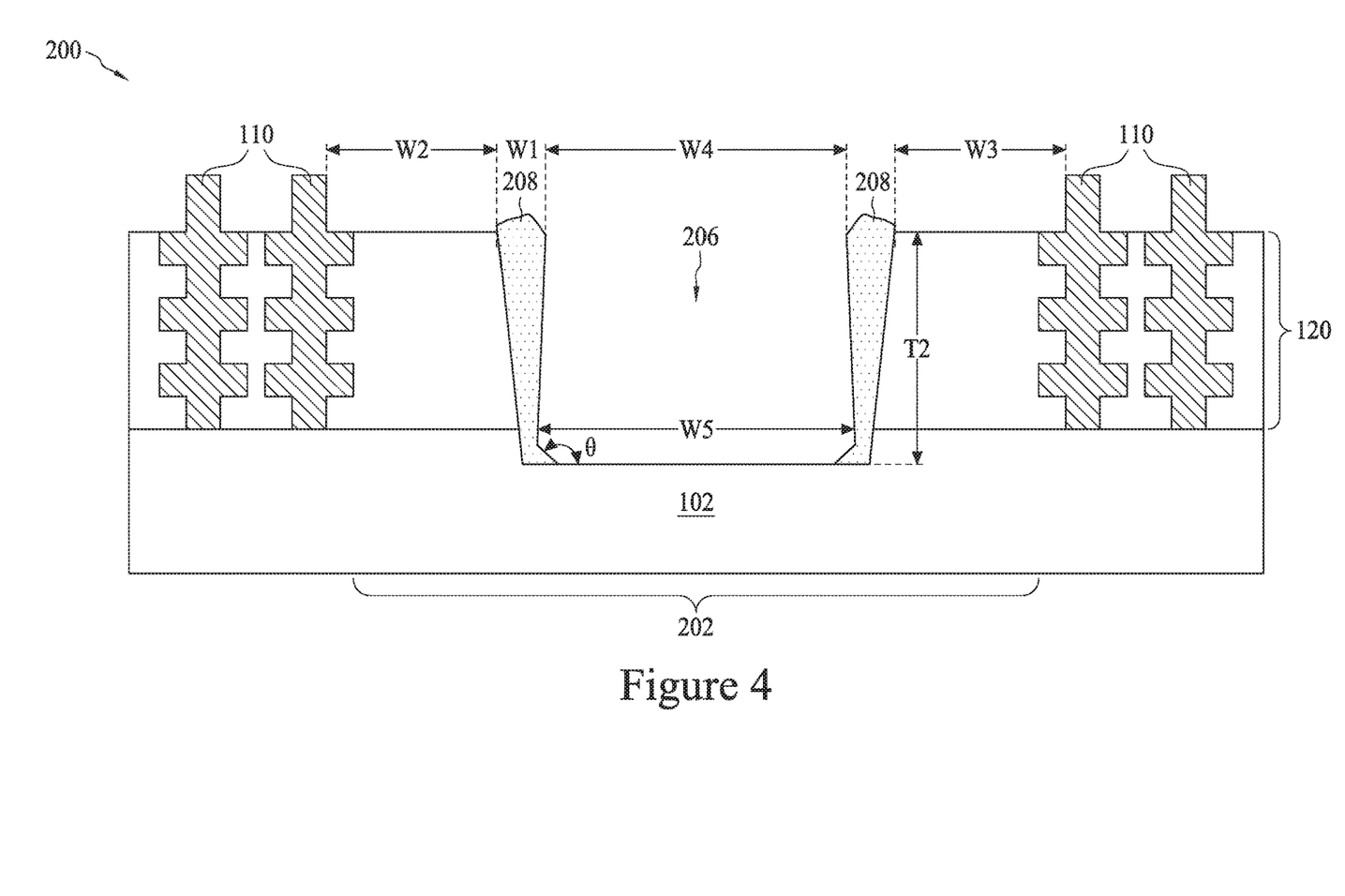
Figure 5:
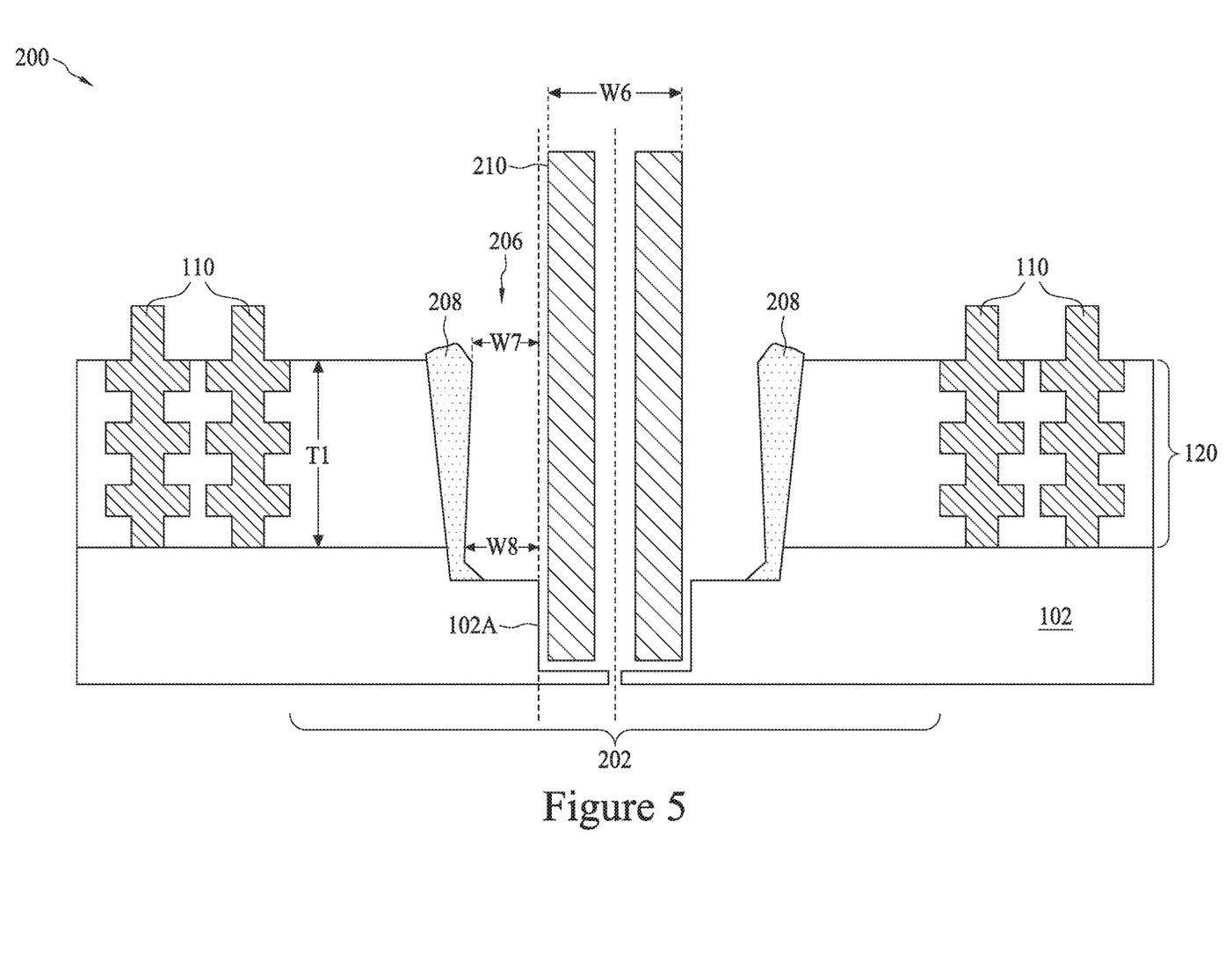

FIGS. 3 through 5 disclose a singulation process used to separate dies 100 from other features in wafer 200 (e.g., other dies 100) in accordance with some embodiments. The singulation process may include a laser ablation process used to form a kerf through the dielectric layers 120 and extending partially into semiconductor substrate 102. The laser ablation process may include multiple passes with a laser beam to provide a kerf of a suitable configuration. After the kerf is formed, a mechanical sawing process may be applied through the kerf to fully singulate dies 100.

Referring first to FIG. 3, a laser ablation process is applied to wafer 200 in scribe line region 202. The laser ablation process may include applying multiple laser beams 204 (labeled 204A through 204I) to dielectric layers 120 and substrate 102. A position, power, number of, and/or type of each laser beam are controlled in order to achieve a desired profile of the resulting kerf. In an embodiment, at least nine laser beams (e.g., labeled 204A through 204I) are applied in order to provide a kerf of a suitable profile. It has been observed than when at least nine laser beams are applied to wafer 200, fewer manufacturing defects may occur as a result of a subsequent mechanical sawing process (see FIG. 5). In other embodiments, a different number of laser beams may be applied to wafer 200, such as greater than nine or fewer than nine.

Laser beams 204A through 204I may be applied to wafer 200 from an outer perimeter of a subsequently formed kerf inwardly. Each laser beam 204A through 204I may extend through dielectric layer 120 and partially into substrate 102. Laser beams 204A through 204I may not penetrate fully through substrate 102, and laser beams 204A through 204I may stop at an intermediary point between top and bottom surfaces of substrate 102. In an embodiment using an outside-in kerf formation process, laser beam 204A is applied before laser beam 204B; laser beam 204B is applied before laser beam 204C; laser beam 204D is applied before laser beam 204E; laser beam 204E is applied before laser beam 204F; laser beam 204F is applied before laser 204G; laser beam 204G is applied before laser beam 204H; and laser beam 204H is applied before laser beam 204I. In other embodiments, laser beams may be applied to wafer 200 in a different order. For example, in another embodiment, laser beams 204A through 204I may be applied to wafer 200 from a center of a subsequently formed kerf outwardly. In an embodiment using an inside-out kerf formation process, laser beam 204I is applied before laser beams 204G or 204H; laser beams 204G and 204H are applied before laser beams 204E or 204F; laser beams 204E and 204F are applied before laser beams 204C or 204D; and laser beams 204C and 204D are applied before laser beams 204A or 204B. Furthermore, each laser beam 204A through 204I may be applied at a power of about 0.1 Watts (W) to about 6 W.

FIG. 4 illustrates the resulting kerf 206 formed using the laser ablation process described with respect to FIG. 3. Kerf 206 extends through dielectric layers 120 and partially into substrate 102. In various embodiments kerf 206 does not extend fully through substrate 102, and a bottom surface of kerf 206 exposes a material of substrate 102. In some embodiments, kerf 206 extends to a depth T2 of about 13 μm or greater into wafer 200. In other embodiments, kerf 206 may extend to a different depth into wafer 200.

Furthermore, as a result of the laser ablation process, recast regions 208 may be formed on sidewalls of dielectric material 120 and substrate 102. These recast regions 208 may be formed as a result of re-deposition of material (e.g., the material of dielectric material 120 and/or substrate 102) irradiated by laser beams 204 (see FIG. 3) during the formation of kerf 206, and sidewalls of kerf 206 may be defined by recast regions 208. Although recast regions 208 are illustrated as being symmetrical (e.g., having a same shape on opposing sidewalls of kerf 206), in some embodiments, recast regions 208 may have different profiles on each sidewall of kerf 206. Recast regions 208 may have a width W1 at a widest point of about 5 μm to about 15 μm. Furthermore, a lateral distance W3 from a first seal ring 110 to a first recast region 208 may be about 10 μm or greater, and a lateral distance W2 from a second seal ring 110 to a second recast region 208 may be about 10 μm or greater. The first seal ring 110/first recast region 208 may be disposed on an opposing side of kerf 206 as the second seal ring 110/second recast region 208. Lateral distances W2 and W3 may be the same or different. In other embodiments, recast regions 208 may have a different dimension and or be disposed a different distance from seal rings 110.

Kerf 206 is formed with a specific profile and/or dimensions in order to reduce manufacturing defects resulting from singulation. For example, kerf 206 has a first width W4 between opposing recast regions 208 at a top surface of dielectric layers 120, and kerf 206 has a second width W5 between opposing recast regions 208 at a bottom surface of dielectric layers 120/top surface of substrate 102. In various embodiments, a ratio of width W4 to width W5 may be about at least 0.6. Furthermore, an angle θ between a bottom surface of kerf 206 and a sidewall of kerf 206 may be about 90° to about 135°. It has been observed that by using a laser ablation process to form kerf 206 with this profile, peeling/cracking of dielectric layers 120 during subsequent mechanical sawing processes (e.g., see FIG. 5) may be reduced. For example, by configuring kerf 206 to be relatively wide at the bottom surface of dielectric layers 120 and to have relatively perpendicular (or obtuse) sidewalls, impact to exposed surfaces of dielectric layers 120 during subsequent mechanical sawing processes (e.g., by a saw blade) can be reduced or at least avoided. By reducing the impact area of saw blade(s) in subsequent mechanical sawing processes, peeling and/or cracking of dielectric layers 120 during these processes can be reduced. Furthermore, a process window for applying a saw blade can be increased without substantial risk of impacting dielectric layer 120 because of the increased overall size of kerf 206 and angle θ. Thus, manufacturing defects may be reduced and yield can be improved. For example, in experiments using the above described process, a 25% improvement in yield of semiconductor devices has been observed.

FIG. 5 illustrates a next step in the singulation process. As shown, a saw blade 210 is employed in a mechanical sawing step to complete the singulation process. Saw blade 210 is aligned to kerf 206 formed by the laser ablation process described above. Saw blade 210 is used to saw completely through the remaining bottom portion of substrate 102. In the illustrated embodiment, saw blade has a width W6. In some embodiments, width W6 is less than width W5 (see FIG. 4) of kerf 206 at a bottom surface of dielectric layers 120. In an embodiment, width W6 may be about 10 µm to about 100 µm, for example, although other values of width W6 may also be used depending on width W5. In other embodiments, saw blade 210 may have a different thickness. Still further, in other embodiments, multiple saw blades (e.g., having a same or different thickness) and multiple mechanical sawing steps may be used to complete the singulation process.

As illustrated by FIG. 5, saw blade 210 forms a sidewall 102A of substrate 102. In an embodiment, a sidewall recast region 208 may be spaced apart from sidewall 102A by a lateral distance W7 at a top surface of dielectric layers 120, and the sidewall of recast region 208 may be spaced apart from sidewall 102A by a distance W8 at a bottom surface of dielectric layers 120. In some embodiments, distance W7 is about 10 µm or greater while distance W8 is about 10 µm to about 20 µm. It has been observed that when widths W4/W5 of kerf 206 (see FIG. 4) and/or distances W7/W8 are in the above ranges, fewer manufacturing defects (e.g., peeling/cracking of dielectric layers 120) result from singulation using saw blade 210.

Figure 6A:
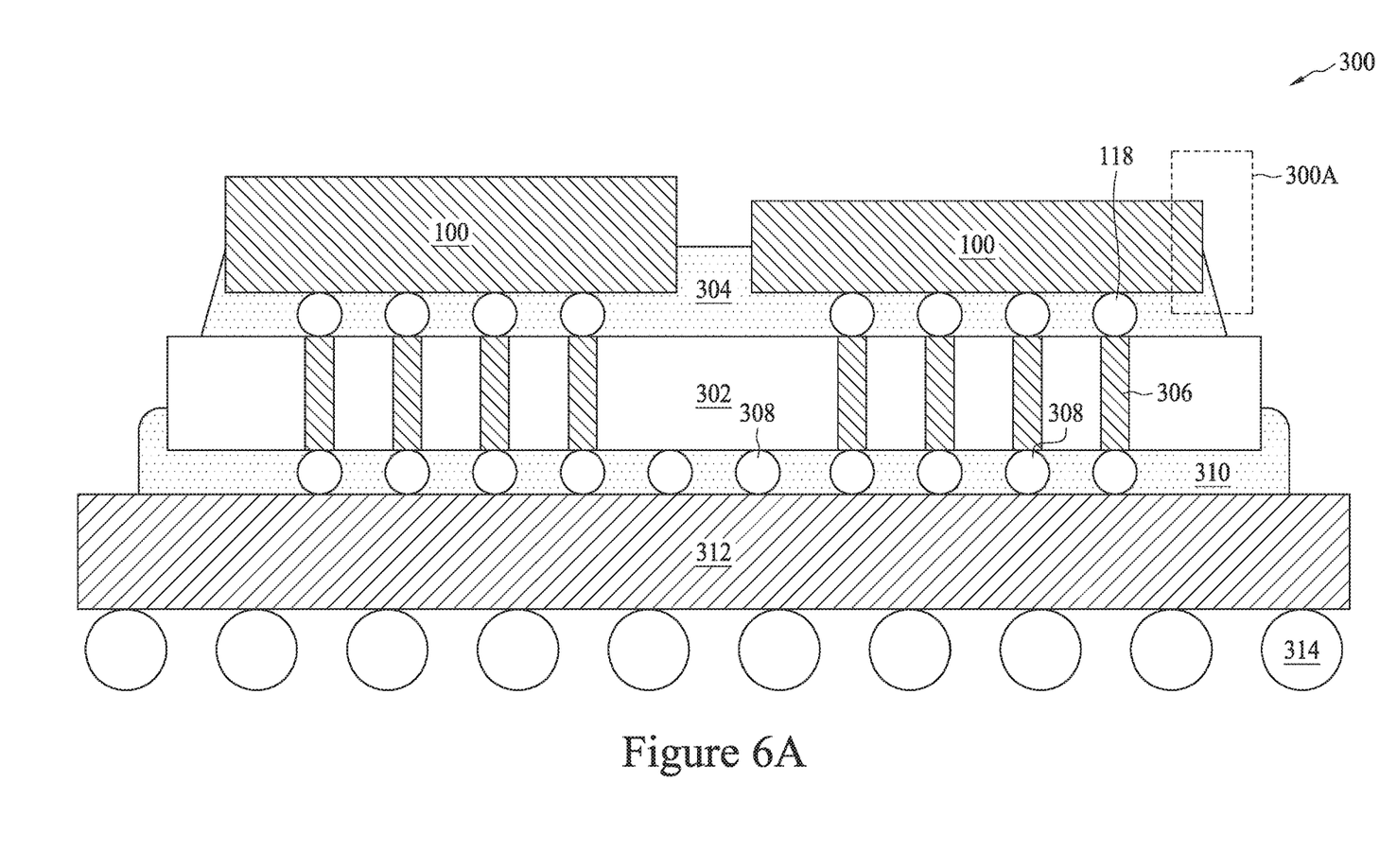
FIGS. 6A and 6B illustrate cross-sectional views of a semiconductor device package in accordance with some embodiments.
Figure 6B:
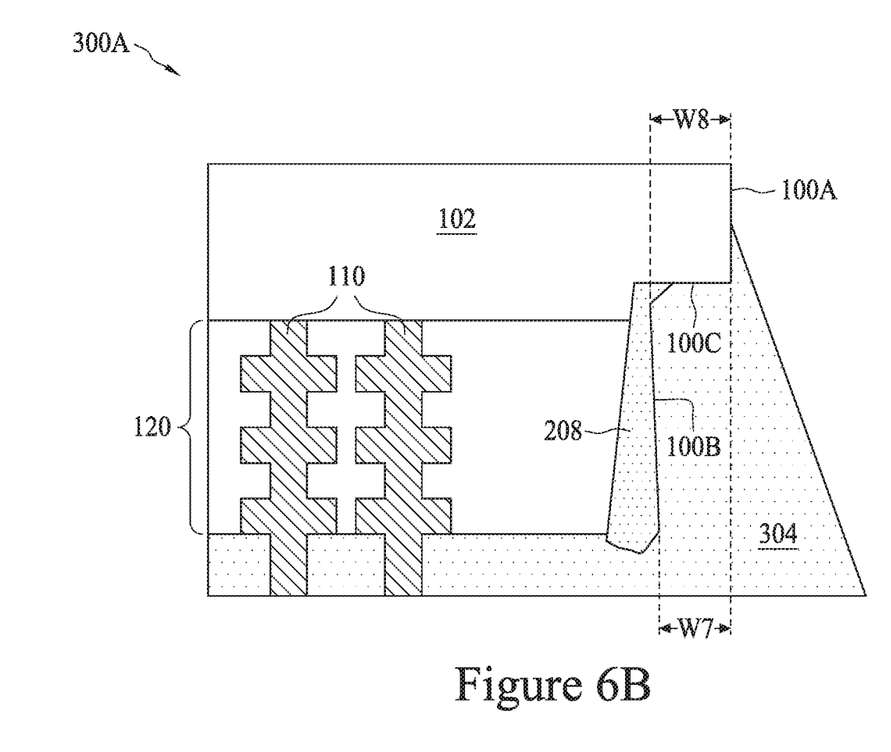

After dies 100 are singulated using embodiment singulation processes, dies 100 may be packaged with other device features in a device package. For example, FIGS. 6A and 6B illustrates a device package 300 having singulated dies 100. In various embodiments, multiple dies 100 (e.g., singulated from a same wafer or different wafers) may be singulated and packaged in a single device package 300. Dies 100 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, dies 100 may be different sizes (e.g., different heights and/or surface areas), and in other embodiments, dies 100 may be the same size (e.g., same heights and/or surface areas).

Dies 100 may be initially bonded to a die 302 while die 302 is part of a larger wafer (not illustrated) using any suitable bonding technique (e.g., flip chip bonding using conductive connectors 118 of dies 100). In some embodiments, die 302 is an interposer without active devices and having conductive vias 306 extending through a substrate material (e.g., silicon, a polymer material with or without fillers, combinations thereof, and the like). Conductive vias 306 provide electrical routing from a surface of die 302 on which dies 100 are bonded to an opposing surface of die 302. For example, conductive vias 306 provide electrical routing between conductive connectors 118 and conductive connectors 308 of die 302. Conductive connectors 308 may be BGA connectors, solder balls, metal pillars, C4 bumps, micro bumps, ENEPIG formed bumps, or the like. Conductive connectors 308 may include a conductive material such as solder, copper, aluminum, gold, nickel, silver, palladium, tin, the like, or a combination thereof. In some embodiments, conductive connectors 308 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, conductive connectors 308 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of metal pillar connectors 306. The metal cap layer may include nickel, tin, tin-lead, gold, silver, palladium, indium, nickel-palladium-gold, nickel-gold, the like, or a combination thereof and may be formed by a plating process.

Furthermore, die 302 may also optionally include redistribution layers (not explicitly illustrated) comprising conductive features, which provide electrical routing between different dies 100 and through die 302. In other embodiments, die 302 may have a different configuration. For example, die 302 may be a semiconductor device die having active devices, passive devices, functional circuits, combinations thereof, or the like disposed therein.

After dies 100 are bonded to die 302, an encapsulant 304 may be formed at least partially around dies 100 and between dies 100 and die 302. Encapsulant 304 may comprise a molding compound, epoxy, an underfill, or the like, and may be applied by compression molding, transfer molding, capillary force, or the like. Encapsulant 304 may be disposed around conductive connectors 118 to provide structural support to conductive connectors 118 in package 300. Furthermore, encapsulant 304 may extend partially along sidewalls of dies 100. In the illustrated embodiment, dies 100 extends higher than encapsulant 304. In other embodiments, encapsulant 304 may extend higher than dies 100 or have a top surface substantially level with a top surface of dies 100.

Due to the singulation process used to singulate dies 100, other sidewalls of dies may have a profile as illustrated by FIG. 6B. FIG. 6B illustrates region 300A (see also FIG. 6A) of package 300. As illustrated by FIG. 6B, die 100 includes a first sidewall 100A and a second sidewall 100B in region 300A and disposed on a same side of die 100. A material of the first sidewall 100A may be the material of substrate 102 while a material of the second sidewall 100B may be the material of recast region 208. A bottom surface 100C of die 100 connects first sidewall 100A to second sidewall 100B. First sidewall 100A is laterally spaced apart from second sidewall 100B by a distance W8 at an interface between dielectric layers 120 and substrate 102, and first sidewall 100A is laterally spaced apart from second sidewall 100B by a distance W7 at a surface of dielectric layers 120 opposite substrate 102. In some embodiments, distance W7 is about 10 μm or greater while distance W8 is about 10 μm to about 20 μm. Encapsulant 304 extends along the second sidewall 100B and may further extend along at least a portion of first sidewall 100A in some embodiments. In such embodiments, encapsulant 304 may contact bottom surface 100C. In other embodiments, encapsulant 304 may have a different shape and/or size relative surfaces of die 100.

Referring back to FIG. 6A, die 302 may be singulated from other features in the wafer (not shown) after encapsulant 304 is formed. In some embodiments, the singulation process may be substantially similar to the singulation process applied to dies 100. In other embodiments, a different type of singulation process (e.g., with or without laser beams) may be applied to singulated die 302.

After die 302 is singulated, die 302 may be bonded to a package substrate 312. Package substrate 312 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, package substrate 312 may be a SOI substrate. Generally, package substrate 312 includes a layer of a semiconductor material such as epitaxial silicon, germanium, silicon germanium, SOI, SGOI, or combinations thereof. Package substrate 312 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as ABF or other laminates may be used for package substrate 312.

Package substrate 312 may include active and passive devices (not shown in FIG. 6A). As one of ordinary skill in the art will recognize, a wide variety of devices such as transistors, capacitors, resistors, combinations of these, and the like may be used to generate the structural and functional requirements of the design for package 300. The devices may be formed using any suitable methods.

Package substrate 312 may also include metallization layers and vias (not shown) and bond pads over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, package substrate 312 is substantially free of active and passive devices.

In some embodiments, conductive connectors 308 on die 302 can be reflowed to attach die 302 to bond pads of package substrate 312. Conductive connectors 308 may have an epoxy flux (not shown) formed thereon before they are reflowed with at least some of the epoxy portion of the epoxy flux remaining after the die 302 is attached to package substrate 312. This remaining epoxy portion may act as an underfill to reduce stress and protect the joints resulting from the reflowing conductive connectors 308. In some embodiments, an underfill 310 may be formed between die 302 and package substrate 312 and surrounding conductive connectors 308. The underfill may be formed by a capillary flow process after die 302 is attached or may be formed by a suitable deposition method before die 302 is attached.

Conductive features in package substrate 312 may electrically connect die 302 and dies 100 to conductive connectors 314 disposed on an opposing side of package substrate 312 as die 302. In some embodiments, conductive connectors 314 are C4 bumps, BGA balls, micro bumps, or the like, and conductive connectors 314 may be used to electrically connect package 300 to other semiconductor features, such as, another package, another package substrate, another interposer, a mother board, or the like.

As described herein, a singulation process may be used to singulate a semiconductor die from other features (e.g., other semiconductor dies) in a wafer. The singulation process may include first using a laser ablation process to form a kerf in the wafer of a suitable profile. Parameters of the laser ablation process (e.g., number of laser beams applied, power, position, order of laser beams applied) may be controlled in order to provide a suitable kerf. For example, the kerf may extend through multiple dielectric layers into a semiconductor substrate. The kerf may have specific widths at opposing lateral surfaces of the dielectric layers to provide a larger process window for subsequent dicing processes. Subsequently, a mechanical sawing process may be applied to fully separate the die from the wafer. It has been observed that by controlling the kerf to have a profile as described above, manufacturing defects (e.g., dielectric layer peeling and/or cracking) can be reduced during the mechanical sawing process. Thus, the reliability of the singulation process and yield may be improved.

In accordance with an embodiment, a method includes providing a wafer including a first integrated circuit die, a second integrated circuit die, and a scribe line region between the first integrated circuit die and the second integrated circuit die. The method further includes using a laser ablation process to form a kerf in the scribe line region and after forming the kerf, using a mechanical sawing process to fully separate the first integrated circuit die from the second integrated circuit die. The kerf extends through a plurality of dielectric layers into a semiconductor substrate. The kerf includes a first width at an interface between the plurality of dielectric layers and the semiconductor substrate and a second width at a surface of the plurality of dielectric layers opposite the semiconductor substrate. A ratio of the second width to the first width is at least about 0.6.

In accordance with an embodiment, a method includes singulating a semiconductor die from a wafer. Singulating the semiconductor die includes forming a kerf in a scribe line region adjacent the semiconductor die using a plurality of laser beams. The kerf extends through a plurality of dielectric layers and partially into a semiconductor substrate. Singulating the semiconductor die further includes aligning a saw blade to the kerf and using the saw blade to saw through a bottom portion of the semiconductor substrate exposed by the kerf. The saw blade is narrower than the kerf at an interface between the plurality of dielectric layers and the semiconductor substrate. The method further includes after singulating the semiconductor die, bonding the semiconductor die to another die using a plurality of conductive connectors. After bonding the semiconductor die, the semiconductor die includes a first sidewall and a second sidewall below the first sidewall. The first sidewall is spaced laterally apart from the second sidewall.

In accordance with an embodiment, a device package includes a first semiconductor die. The first semiconductor die includes: a semiconductor substrate, a plurality of dielectric layers having an interface with the semiconductor substrate, a first sidewall, and a second sidewall below the first sidewall and disposed on a same side of the first semiconductor die as the first sidewall. The first sidewall extends laterally past the second sidewall. The device package also includes a second semiconductor die bonded to the first semiconductor die by a plurality of conductive connectors. The device package also includes an underfill disposed around the plurality of conductive connectors. The underfill extends along the second sidewall of the first semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor die, wherein the semiconductor die comprises:
      a semiconductor substrate;
      a plurality of dielectric layers on the semiconductor substrate, a first dielectric layer of the plurality of dielectric layers forming an interface with the semiconductor substrate;
      a first sidewall provided by the semiconductor substrate;
      a second sidewall below the first sidewall and disposed on a same side of the semiconductor die as the first sidewall, wherein the first sidewall is spaced laterally apart from the second sidewall, and wherein a material of the second sidewall is a material of a recast region, and wherein the recast region comprises a material of the plurality of dielectric layers; and
   an underfill extending along the second sidewall of the semiconductor die and below the semiconductor die.

2. The device of claim 1 further comprising an interposer bonded to the semiconductor die by a plurality of conductive connectors, wherein the underfill is disposed around the plurality of conductive connectors.

3. The device of claim 1, wherein the first sidewall is spaced laterally apart from the second sidewall by a first distance at the interface between the first dielectric layer and the semiconductor substrate, wherein the first sidewall is spaced laterally apart from the second sidewall by a second distance at surface of the plurality of dielectric layers opposite the semiconductor substrate, wherein the first distance is in a range of 10 µm to 20 µm, and wherein the second distance is at least 10 µm.

4. The device of claim 1, wherein the semiconductor die further comprises a bottom surface connecting the first sidewall to the second sidewall, and wherein an angle between the second sidewall and the bottom surface is in a range of 90° to 130°.

5. The device of claim 1, wherein the underfill further extends along the first sidewall.

6. The device of claim 1, wherein the semiconductor die comprises a seal ring disposed around a circuit region of the semiconductor die.

7. The device of claim 6, wherein the underfill contacts the seal ring.

8. A semiconductor package comprising:
   a first die comprising:
      a first side surface defined by a semiconductor substrate of the first die;
      a second side surface defined by a recast region, the second side surface is laterally spaced apart from the first side surface, the recast region contacts the semiconductor substrate; and
      a lateral surface extending from the first side surface to the second side surface;
   a second die bonded to the first die by a first plurality of conductive connectors; and
   a first underfill between the first die and the second die, the first underfill being disposed around the first plurality of conductive connectors.

9. The semiconductor package of claim 8, wherein the first underfill contacts the recast region.

10. The semiconductor package of claim 8, wherein the first underfill contacts the semiconductor substrate.

11. The semiconductor package of claim 8 further comprising:
    a package substrate bonded to an opposing side of the second die as the first die by a second plurality of conductive connectors; and
    a second underfill between the package substrate and the second die, the second underfill being disposed around the second plurality of conductive connectors.

12. The semiconductor package of claim 11, wherein the second underfill contacts a side surface of the second die.

13. The semiconductor package of claim 11, wherein the first die comprises a plurality of dielectric layers on the semiconductor substrate, wherein the first side surface is spaced laterally apart from the second side surface by a first distance at a lateral surface of the semiconductor substrate, wherein the first side surface is spaced laterally apart from the second side surface by a second distance at surface of the plurality of dielectric layers opposite the semiconductor substrate, and wherein the first distance is different from the second distance.

14. The semiconductor package of claim 13 further comprising a seal ring extending through the plurality of dielectric layers, wherein the first underfill contacts the seal ring.

15. A package comprising:
    a first semiconductor die comprising:
       a semiconductor substrate;
       a plurality of dielectric layers on the semiconductor substrate;
       a recast region contacting a sidewall of the plurality of dielectric layers and contacting a first sidewall of the semiconductor substrate, wherein the semiconductor substrate extends laterally from the plurality of dielectric layers past the recast region;
    an interposer bonded to the first semiconductor die; and
    a package substrate bonded to an opposing side of the interposer as the first semiconductor die.

16. The package of claim 15 further comprising a second semiconductor die bonded to the interposer adjacent the first semiconductor die.

17. The package of claim 15 further comprising an underfill between the interposer and the first semiconductor die, wherein the interposer extends along a sidewall of the recast region.

18. The package of claim 17, wherein the underfill extends along a second sidewall of the semiconductor substrate, the second sidewall of the semiconductor substrate is disposed laterally apart from the first sidewall of the semiconductor substrate.

19. The package of claim 18, wherein the underfill contacts a lateral surface of the semiconductor substrate, the lateral surface of the semiconductor substrate connecting the first sidewall of the semiconductor substrate to the second sidewall of the semiconductor substrate.

* * * * *

UNITED STATES PATENT AND TRADEMARK OFFICE
CERTIFICATE OF CORRECTION

PATENT NO. : 10,510,605 B2
APPLICATION NO. : 16/043860
DATED : December 17, 2019
INVENTOR(S) : Fu-Chen Chang et al.

Page 1 of 1

It is certified that error appears in the above-identified patent and that said Letters Patent is hereby corrected as shown below:

In the Specification

In Column 1, Line 7, delete "Jul. 29, 2016" and insert --Dec. 9, 2016--.

Signed and Sealed this
Fifth Day of May, 2020

Andrei Iancu
*Director of the United States Patent and Trademark Office*